United States Patent
Korherr

(10) Patent No.: US 10,277,225 B2
(45) Date of Patent: Apr. 30, 2019

(54) SWITCHING DEVICE HAVING A HAPTIC FEEDBACK

(71) Applicant: TRW AUTOMOTIVE ELECTRONICS AND COMPONENTS GMBH, Radolfzell (DE)

(72) Inventor: Joachim Korherr, Orsingen (DE)

(73) Assignee: TRW Automotive Electronics and Components GmbH, Radolfzell (DE)

(*) Notice: Subject to any disclaimer, the term of this patent is extended or adjusted under 35 U.S.C. 154(b) by 0 days.

(21) Appl. No.: 15/571,060

(22) PCT Filed: May 10, 2016

(86) PCT No.: PCT/EP2016/060432
§ 371 (c)(1),
(2) Date: Nov. 1, 2017

(87) PCT Pub. No.: WO2016/184728
PCT Pub. Date: Nov. 24, 2016

(65) Prior Publication Data
US 2018/0167068 A1 Jun. 14, 2018

(30) Foreign Application Priority Data

May 19, 2015 (DE) .................. 10 2015 107 828

(51) Int. Cl.
*G06F 3/01* (2006.01)
*H01F 7/16* (2006.01)
*H03K 17/96* (2006.01)

(52) U.S. Cl.
CPC .......... *H03K 17/962* (2013.01); *G06F 3/016* (2013.01); *H01F 7/1638* (2013.01); *H03K 2217/96062* (2013.01)

(58) Field of Classification Search
CPC ......... B06B 1/0629; G06F 2203/04808; G06F 3/016; G06F 3/041; G06F 3/0414; G06F 3/044; H01H 2215/00
USPC ...................................... 340/407.1
See application file for complete search history.

(56) References Cited

U.S. PATENT DOCUMENTS

| 5,189,390 A | 2/1993 | Fagard |
| 8,593,409 B1 * | 11/2013 | Heubel .............. G06F 3/041 340/407.1 |
| 2009/0174672 A1 | 7/2009 | Schmidt |
| 2010/0238053 A1 | 9/2010 | Schmidt et al. |
| 2011/0037546 A1 * | 2/2011 | Marie .............. G06F 3/016 335/230 |

(Continued)

FOREIGN PATENT DOCUMENTS

JP 2008289058 11/2008

*Primary Examiner* — Emily C Terrell
(74) *Attorney, Agent, or Firm* — Tarolli, Sundheim, Covell & Tummino LLP

(57) ABSTRACT

A switching device, in particular in a motor vehicle, includes a control element (12) having an operating interface (14) which may include a plurality of control panels (16). A haptics actuator which is seated in the interior of the switching device provides a haptic response by displacing the control element (12) in a lateral direction as soon as a switching signal is generated. The haptics actuator has a force-travel characteristic with a second force maximum which is remote from the end stop and in the range of which the working travel is placed.

22 Claims, 4 Drawing Sheets

(56) References Cited

U.S. PATENT DOCUMENTS

| | | | |
|---|---|---|---|
| 2011/0074559 A1 | 3/2011 | Pfau et al. | |
| 2012/0306798 A1* | 12/2012 | Zoller | G06F 3/016 345/173 |
| 2014/0139476 A1* | 5/2014 | Lange | G06F 3/016 345/173 |
| 2015/0009178 A1 | 1/2015 | Schneider et al. | |

* cited by examiner

SWITCHING DEVICE HAVING A HAPTIC FEEDBACK

RELATED APPLICATIONS

This application corresponds to PCT/EP2014/060432, filed May 10, 2016, which claims the benefit of German Application No. 10 2015 107 828.7, filed May 19, 2015, the subject matter of which are incorporated herein by reference in their entirety.

BACKGROUND OF THE INVENTION

The invention relates to a switching device, in particular in a motor vehicle, which includes a control element having an operating interface.

More particularly, the invention relates to a switching device accommodated on the vehicle steering wheel or in the area of the doors or of the dashboard or the center console, for example, and serving for the control of a plurality of functions.

More recent switching devices in vehicles usually have a smooth, continuous surface below which a plurality of sensors is accommodated for controlling a variety of devices in a vehicle. The continuous operating interface on the control element results in a high-quality design. The individual control panels which are associated with the individual sensors are usually identified by symbols that are illuminated by the control panel being configured to be transparent in sections. The sensors located behind the control element are pressure-sensitive or touch-sensitive, in the case of pressure-sensitive sensors, the control element in the respective control panel will generally slightly yield, for example by an inherent elasticity. Since the switching travel is thus below the operators threshold of perception, the control element is moved laterally to a minimal extent by an electric drive to obtain a haptic feedback to the operator. The operator himself/herself is unable to distinguish this minimal lateral movement from a yielding or deflection of the control element, so that he/she is given the impression of a kind of snap-in or clicking of a switch as a response to an actuation of a switch. This electric motor system usually includes an electric haptics actuator which is mechanically coupled to the control element and displaces the latter for generating a haptic response signal when a switching signal is triggered. The haptics actuator comprises a coil and an armature. The armature is mounted in the coil with one or two end stops against which it abuts upon its reciprocating movement.

SUMMARY OF THE INVENTION

It is the object of the invention to improve a switching device, in particular in a vehicle, in such a way that the switching device is subjected to a lower degree of wear and functions very quietly in operation.

This object is achieved by a switching device which includes a control unit having an operating interface, an electric haptics actuator which is mechanically coupled to the control unit and displaces the latter for generating a haptic response signal when a switching signal is triggered, the haptics actuator having a coils an armature that is displaceable by the coil, and at least one internal end stop for the armature movement, and the control element being mounted and coupled to the haptics actuator such that the working travel of the haptics actuator is remote from the end stop.

The switching device according to the invention makes provision that the end stop for the armature, which had so far been provided inside the coil or at the coil, is no longer used since the working travel i.e. the working range of the armature, is remote from the end stop. This end stop, which had previously always been made use of, caused noises during operation in the form of unpleasant metallic rattling noises or vibration noises. This means that according to the invention, the working travel is remote from the end stop, so that the armature reaches neither the metallic part of the end stop nor a damper that may be placed thereon when it is displaced by the coil or by a restoring element. The displacement of the working travel, provided according to the invention, is not obvious above all because the armature is usually displaced with the greatest force on the end stop. This means that the haptics actuator has a force-travel characteristic with a maximum at the end stop, which is also of advantage to the effect that the movement which the armature should cause must proceed quickly, which is why the maximum force available to the coil is also utilized in the prior art. The invention deliberately detaches itself from this previous concept.

According to one configuration of the invention, provision is made that the haptics actuator, starting from its end stop, has a force-travel characteristic with a force maximum remote from the end stop and a force minimum located between the end stop and the force maximum, the working travel of the actuator being located in a section remote from the end stop. In other words, as usual, the haptics actuator according to the Invention also has a force maximum at the end stop. However, the force does not drop as the displacement path increases, as was the case with previous haptics actuators. Rather, a second force maximum is provided that is remote from the end stop, and the working travel is located in the range about the second force maximum of the characteristic.

One possibility of realizing such a second maximum in the force-travel curve consists in that a ferromagnetic core that is adjacent to the coil has a varying thickness in the area of the working travel, preferably a thickness that increases from a starting position of the coil in the working travel to the deflection position. The ferromagnetic core may also substantially completely surround the coil, i.e., it may have a cross-section of a surrounding hollow profile. An air gap is formed, for example, in the area of the varying thickness. Owing to the smaller iron core cross-section in the area of reduced thickness, the flux line absorbing capacity decreases in this area while, vice versa, the magnetic saturation and the force increase as the cross-section increases in the ferromagnetic core. Preferably, the thickness of the ferromagnetic core continuously increases towards the deflection position. It is particularly effective if the ferromagnetic core or at least that part of the ferromagnetic core which has the varying thickness is positioned between the coil and the armature.

Provision may be made for an elastic restoring element which pushes the control element and the armature from a position as deflected by the coil back to a starting position. Such restoring element may rest directly against the armature or against the control element.

As already discussed above, the control element is preferably mounted for linear displacement transversely to the direction of switch actuation. The switch actuation direction is usually perpendicular to the operating interface or, if the operating interface is curved, it is perpendicular to that area of the operating interface which features the control panel to be operated.

The working travel may be defined by two stops between which a part that is mechanically coupled to the armature and is to be displaced is linearly displaceable. This pad to be displaced is more particularly the control element itself. This means that it is the control element that strikes against a stop, rather than the metallic armature, as a result of which a higher degree of damping is provided by nature since the control element is usually made from plastic. For another thing, this provides for a considerable advantage in that long tolerance chains can not develop as far as the position and extent of the working travel are concerned. The part to be actuated itself, i.e. the control element, is to be moved between its stops.

A lower housing part which has the two stops formed thereon may provide a bearing. The lower housing part may, for example, include a recess having two opposite wall sections which form the two stops. An extension of the part to be displaced protrudes into the recess and strikes against the wall sections in an alternating fashion when the actuator is actuated. In this case, too, a very short tolerance chain is obtained since the lower housing part is that part that is locked in place at the vehicle.

The tower housing part may be formed with a receiving geometry for receiving and mounting the haptics actuator; when the lower housing part is made from a plastic material, for example, the receiving geometry may be provided in the form of depressions in the injection mold.

The switching device is mounted substantially rigidly in the direction of switch actuation, for example, and has at least one touch-sensitive sensor. This means that there is no need for a displaceable mounting for the control element, which might result in the existence of gaps relative to the adjacent part. The touch-sensitive sensor does not require a deformation of the control element, but, rather, it is sufficient to touch the control element at a corresponding point to generate a switching signal.

In one variant of the invention, provision is made that the switching device includes at least one touch-sensitive, in particular capacitive sensor and/or at least one pressure-sensitive sensor which detects the actuation of the control element.

The control element is, for example, a one-piece part having a plurality of control panels which are next to each other and each of which has at least one sensor assigned to it for detecting the operation of this control panel.

Furthermore, the linear support of the control elements provided in the prior art is worthy of improvement because it is either complicated to produce or involves additional expenditure during assembly. For this reason, it is a further object of the present invention to provide a switching device in which the support of the control element is designed to be simple end cost-effective.

This is achieved in a switching device, preferably in a motor vehicle, in that the switching device includes a control element having an operating interface, and an electric haptics actuator which is mechanically coupled to the control element and displaces the latter transversely to the direction of the switch actuation in a displacement direction along a linear support for generating a haptic response signal when a switching signal is triggered, the linear support including at least one rod extending in the displacement direction and at least one sliding element which is seated on the rod and is displaceable along the rod and relative to it, and the control element being mounted via a clip connection in addition to the linear support, the clip connection preventing the control element from swiveling around the rod and allowing a movement of the control element in the displacement direction.

Preferably, the clip connection is provided bare between the control element and the lower housing part, but this should not be understood in a limiting sense.

The rod is a very simple type of linear support which, however, constitutes only part of the linear support. In fact, the switching device according to the invention provides, on the other hand, that the control element is additionally simply mounted by means of a clip connection. This obviates the need for a plurality of rods, which run parallel to one another and would involve an increase in expenditure to align them; rather, a linear support with the aid of a rod and a dip connection ensures that the control element is held in place. The clip connection, however, is designed specially since it holds the control element against the other part only so as to prevent it from swiveling, but not from being displaced in a linear direction. Thus, for fitting the control element, it is fastened to the other part in the region of the linear support and is swiveled towards this part in order to be finally quite simply clipped in.

The rod may be a separately produced part, in particular a metal wire or a metal rod, which is held by means of at least one bearing block. The bearing block may, for example, be integrally molded, that is, usually integrally injection molded, with the control element on the inside, which does not generate any additional manufacturing expenditure. The rod can then be quite simply pushed into or clipped into the bearing block from the side or in the longitudinal direction.

The linear support may extend along an edge of the control element, and the clip connection may be provided on the opposite edge, so as to generate as high a stability as possible.

The object to provide an improved switching device is also achieved by a switching device including a control element having the operating Interface and at least one control panel which has both a touch-sensitive, in particular a capacitive sensor and a pressure-sensitive sensor associated with it, the two sensors being configured such that they jointly activate an operating function.

While there are switching devices in the prior art which include both a touch-sensitive sensor and a pressure-sensitive sensor, these sensors are associated with different operating functions and/or different control panels. The solution according to the invention, however, makes provision that two sensors, namely, a touch-sensitive sensor and additionally a pressure-sensitive sensor, are available for the same operating function and the same control panel. This arrangement considerably increases the resolution for sensing the fingers of the operator; any incorrect activation or inadvertent activation of functions associated with the neighboring operating panel can he avoided. It is not until both sensors impinge, i.e., detect a finger and also detect a pressure, that the control panel is regarded as being actuated and an operating function associated with this control panel will be activated.

The pressure-sensitive sensor is preferably located spaced apart from the control element in the interior of the switching device. For force transmission, a pressure tappet which is more particularly configured as an optical waveguide element is provided for each control panel on the inside of the control element. This pressure tappet passes a pressure force applied to the control panel on to the pressure-sensitive sensor located underneath.

A particularly effective embodiment of the invention makes provision that a capacitor plate of the pressure-sensitive sensor constitutes at the same time a capacitor plate of a touch-sensitive sensor. This means that both sensors are capacitive sensors. The double function exhibited by a capacitor plate allows to save parts and installation space to a considerable extent.

The switching devices in vehicles have extremely small dimensions, but nonetheless also have tolerance chains because of the numerous parts provided. In view of the short switching paths or the high detection accuracy, it is important that the parts are precisely positioned with respect to each other.

The present invention further provides for a simplified structure and for ensuring the starting positions of parts, in particular in the region of the control element and the sensor system.

This is achieved by a switching device which includes a control element having an operating interface and at least one control panel which has a touch-sensitive sensor associated with it, a tolerance compensation element being provided between two adjacent parts which is designed to be elastic, electrically conductive and is electrically coupled to a capacitor plate of the at least one touch-sensitive sensor.

The elastic tolerance compensation element has a double function. For one thing, it has a mechanical function by its being clamped between two adjacent parts such that it pushes these parts away from each other in the region of the sensor and the control element, thus positioning them in starting positions. In this way, the tolerance compensation element fills a gap within the tolerance chain, the gap having a slightly different dimension in each switching device. The second function is an electrical function since the sensitive area of the sensor is increased and shifted closer to the control element by means of the tolerance compensation element, so that the sensitivity of the touch-sensitive sensor is increased.

The tolerance compensation element may be accommodated in a pretensioned state in a space between a front face of the tappet facing away from the control element and an adjacent part. The tolerance compensation element therefore has an advantageous effect on the pressure-sensitive sensor and the activation thereof. The tappet is pushed to a starting position by the tolerance compensation element at all times, so that it is not necessary to provide a return spring.

A holding projection which fixes the tolerance compensation element in place laterally may protrude on the side of the tappet facing away from the control element. Here, the tolerance compensation element may have a complementary recess in the region of the holding projection, so that if can not be moved out of its position when there are vibrations in the vehicle or during actuation. As already discussed, it is possible to use the tolerance compensation element as a restoring element for the control element, in particular for an associated control panel. The restoring element pushes the control element from an engaged switching position back to a starting position. Alternatively or additionally, the control element may be rigidly mounted in the operating direction and elastically deformable for actuation of the pressure-sensitive sensor, so that in this case, the tolerance compensation element need not exert a restoring function.

Optional design configurations for the tolerance compensation element consist, among others, in giving it a plate-shaped configuration and/or to produce it from an electrically conducting plastic material, for example a foamed material.

Preferably, each control panel is provided with a tolerance compensation element of its own, and the tolerance compensation elements are spaced apart from one another so as to exclude any mutual influence.

If the pressure-sensitive sensor is a capacitive sensor, it would be suitable to electronically couple the tolerance compensation element to the adjacent capacitor plate of the pressure-sensitive sensor, with the tolerance compensation element in this case being preferably located between this capacitor plate and the control element, as a result of which this capacitor plate is, as it were, lengthened towards the operating interface, resulting in that the sensor has a sensor area that is shifted further towards the control element.

Alternatively or additionally, it is possible to have the tolerance compensation element directly rest on a capacitor plate of the at least one pressure-sensitive sensor. As discussed above, this capacitor plate may, of course, also be a shared capacitor plate of the pressure-sensitive sensor and the touch-sensitive sensor.

It should be emphasized that the above-mentioned features and options may also be combined with each other as desired in order to still further optimize the switching device according to the invention. From a technical point of view, there is no limitation to such combinations.

BRIEF DESCRIPTION OF THE DRAWINGS

Further features and advantages of the invention will be apparent from the description below and from the accompanying drawings, to which reference is made and in which.

DESCRIPTION

Figure 1:
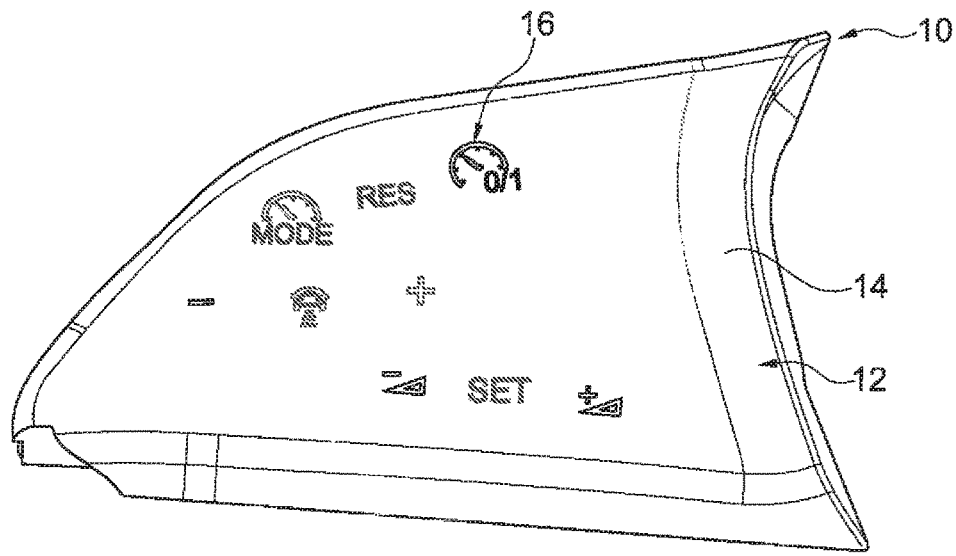
FIG. 1 shows a top view of an embodiment of the switching device according to the invention, with a view of the control element.

FIG. 1 shows a switching device 10 which is installed in a motor vehicle, in this case in a portion of the steering wheel. But it should be emphasized that the structure of this switching device as shown, which will be discussed below, may of course also be implemented in a switching device which is installed in the dashboard or at some other place in the vehicle interior.

The continuous, smooth operating interface 14 of the control element 12, which includes a plurality of switching symbols, can be seen in FIG. 1. These switching symbols may be printed on; at all events, they are backlit. For this purpose, the control element 12 is transparent or translucent in sections. The operating interface 14 is smooth and there are no gaps between the control panels 16. Rather, the control element 12 is in the term of a continuous, one-piece, substantially rigid body.

Figure 2:
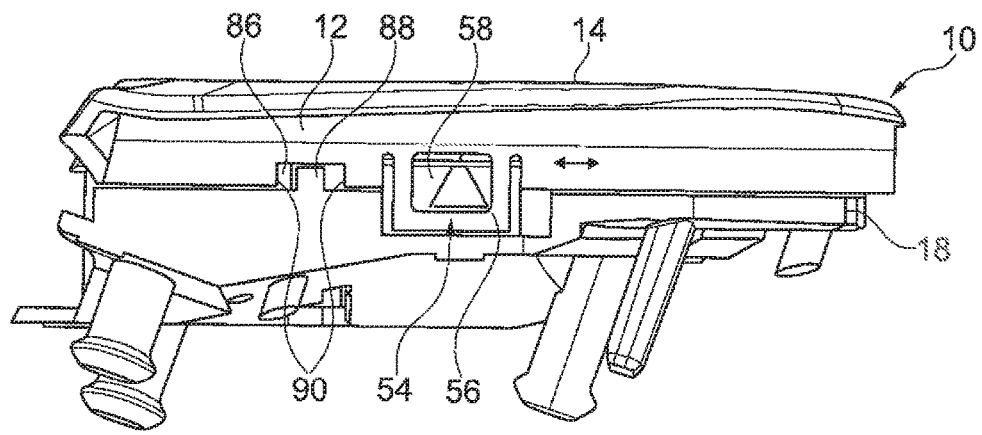
FIG. 2 shows a side view of the switching device according to FIG. 1.

FIG. 2 shows that the outer housing of the switching device 10 consists not only of the shell-shaped control element 12, but also of a lower housing part 18 which is arranged under it and which is also of a shell-shaped configuration and is made of plastic.

For each control panel 16 a separate sensor system is provided which detects an actuation of the respective function and the respective device in the vehicle.

Figure 3:
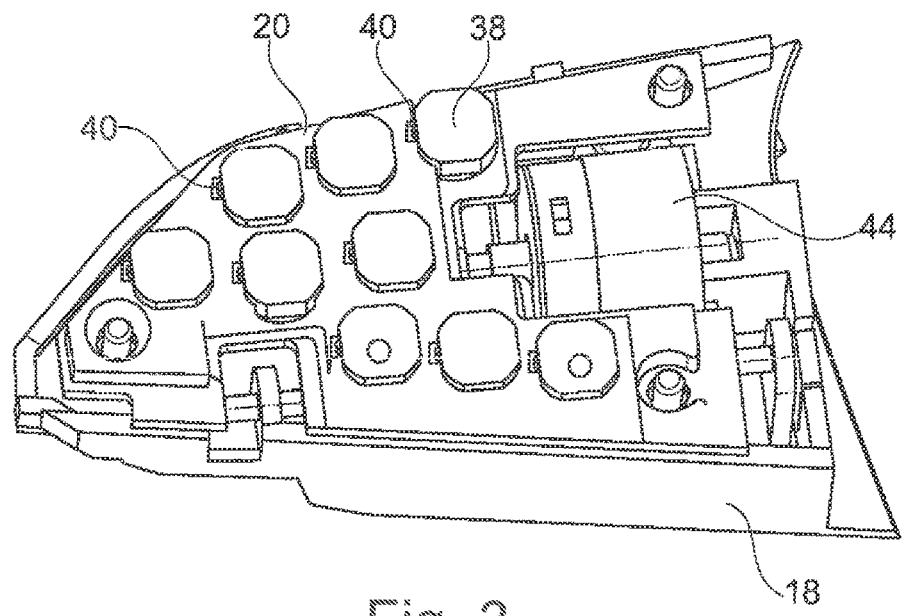
FIG. 3 shows a perspective top view of the switching device according to FIG. 1, with the control element removed.

FIG. 3 shows that a separate sensor system is provided for each control panel 16, Here, a touch-sensitive sensor and, additionally, a pressure-sensitive sensor as well are provided for each control panel 16, which detect the actuation of the control element at the respective place. Providing two different sensors for the same control panel 16 allows a very high accuracy to be attained in detecting a process of user operation.

In this embodiment, both the touch-sensitive sensor and the pressure-sensitive sensor are in the form of capacitive sensors. A printed circuit board 20 having appropriate circuits carries a thin metal layer, for example of copper, on its upper side associated with the control element 12 in the area of each control panel 16, the metal layer constituting the lowermost capacitor plate 22 of the pressure-sensitive sensor. A thin, elastic film 24 or adhesive layer electrically separates the capacitor plate 22 from a capacitor plate 26 positioned over it. The two flexible capacitor plates 22, 26 thus form the pressure-sensitive sensor 28. The printed circuit board 20 may already be complete with the pressure-sensitive sensor 28 applied thereon, or each of these pressure-sensitive sensors 28 may be a finished part which is only later placed onto the printed circuit board 20 and electrically connected to it.

The capacitor plate 26 is adjoined at its top by an elastic tolerance compensation element 30 which is made of a plastic material, for example a foamed material, and is also of a plate-shaped design. The tolerance compensation element 30 is configured to be electrically conductive and is electrically connected to the capacitor plate 26 in order to make the capacitor plate 26 longer or thicker towards the control element 12.

The capacitor plate 26 along with the elastic tolerance compensation element 30 further constitutes the capacitor plate of the touch-sensitive sensor 32 which detects a touch of the operating interface 14 in the area of the associated control panel 16. The capacitor plate 26 therefore has a double function by it being associated with both sensors 26, 32. The plate- or disk-shaped tolerance compensation element 30 has a central recess 34 into which a holding projection 36 of an optical waveguide element 38 protrudes in order to laterally fix the tolerance compensation element 30 in place. The waveguide element 38 is made of a plastic material, as the name suggests, and is intended to pass the light of an associated LED 40 which is seated on the printed circuit board 20 (see FIG. 3) and is introduced laterally into the optical waveguide element 38 on to the control element 12 in order to backlight the respective symbol.

The optical waveguide element 38 touches the bottom side of the control element 12 and is slightly pretensioned upward by the tolerance compensation element 30 since the tolerance compensation element 30 is seated in a pretensioned state between two adjacent parts, namely the optical waveguide element 38 and the sensor 28 and thus the printed circuit board 20.

The optical waveguide elements 38 are mounted by lateral holding means 42 between them. The optical waveguide element 38 is at the same time a pressure tappet since it introduces the minimal deflection upon depression or pushing of the control element 12, which is rigidly mounted in the operating direction A, into the pressure-sensitive sensor 28. The minimal deflection during operation is preferably effected by an elastic deformation of the control element 12. The pressure-sensitive sensor 28 is so sensitive that the interposition of the tolerance compensation element 30 has no adverse effect on the detection of a switch actuation. The tolerance compensation element 30 at least assists in the return of the control element 12 from the engaged switching position to the starting position and can serve as a restoring element here. If the control element 12 is not mounted rigidly, but is yielding in the operating direction A, the tolerance compensation element 30 may even be the only restoring element.

The operating function associated with the control panel 16 that has been actuated is only triggered when both sensors 28, 32 actually detect an operation, that is, were brought to a switching position. The touch-sensitive sensor 32 still further considerably increases the resolution of the whole sensor system.

It is intended to give feedback to the user during switching to the effect that a switching signal is actually being supplied now. The feedback to the user occurs by means of a haptic response signal, for which purpose the control element 12 is reciprocated laterally to a minimum degree by a haptics actuator 44, see FIGS. 5 and 6.

The deflection (working travel) of the control element 12 amounts to only a few tenths of a millimeter, preferably about 0.2 mm. To allow this deflection, the control element 12 is supported for lateral movement. This support is a linear support obtained in that a rod 48 extends on a longitudinal edge 46 of the lower housing part 18; the rod 48 is preferably made of metal and is therefore produced separately and is firmly seated in bearing blocks 50 integrally molded with the lower housing part 18. The control element 12 has, on the bottom side thereof, sliding elements 51 which are also integrally molded and are also seated on the rod 48, but which are provided with a minimal clearance in relation to the rod 48, so that the control element 12 can be linearly displaced along the rod 48 or could also be swiveled in relation thereto.

A clip connection 54 which prevents the control element 12 from swiveling is formed on the edge 52 opposite to the edge 46, between the control element 12 and the lower housing part 18. The clip connection 54 comprises a tongue 56 which has a window and is shaped on the control element 12, and a hook-shaped projection 58 which is again shaped on the lower housing part 18 (see also FIG. 2).

Figure 7:
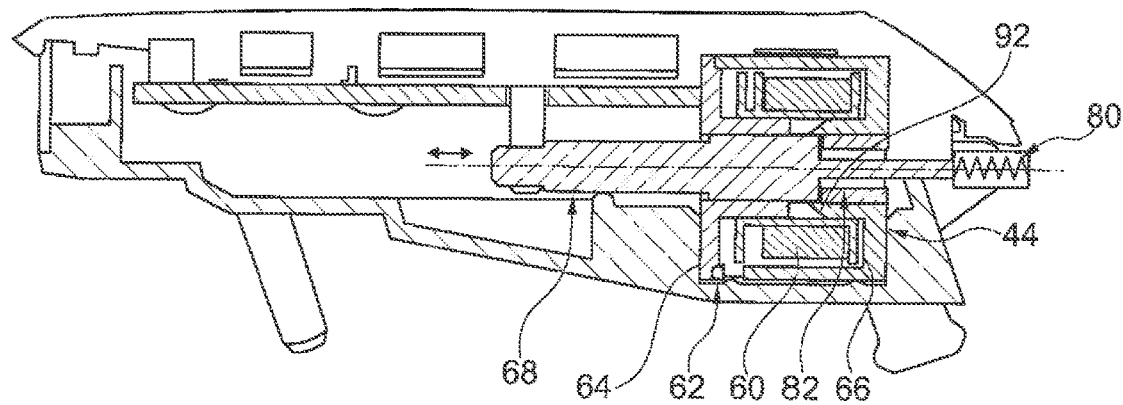
FIG. 7 shows a schematic sectional view of the switching device according to FIG. 1 in the area of the longitudinal axis of the haptics actuator.

The clip connection acts in the swivel direction, that is, in the direction around the rod 48, but allows a movement along the rod 48, as is symbolized by the double arrow in FIG. 2. As mentioned above, an electrically actuated haptics actuator 44, which can be seen in FIG. 7, accounts for the lateral movement.

Figure 4:
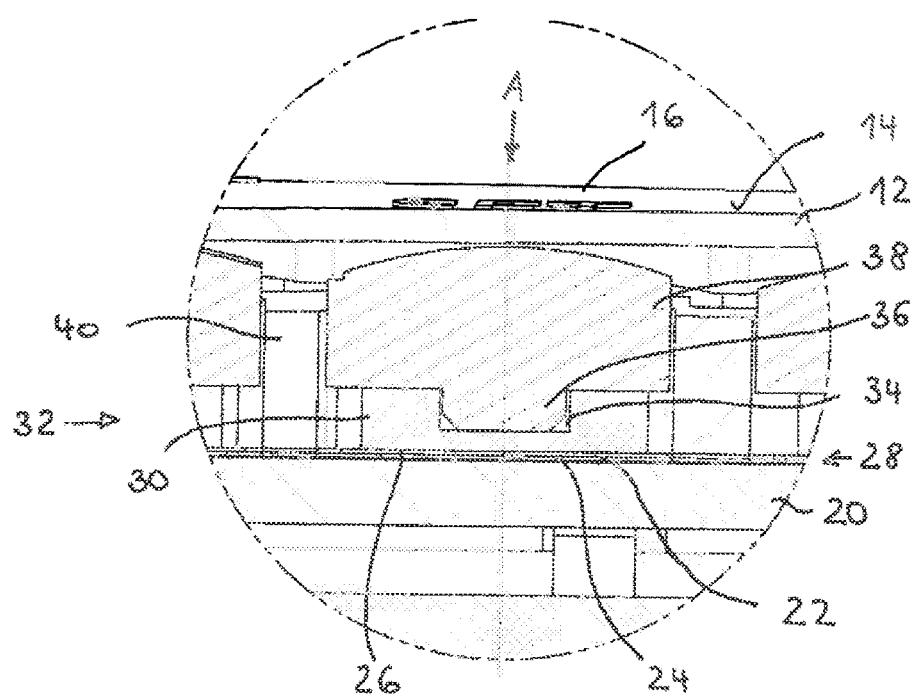
FIG. 4 shows a greatly enlarged sectional view of the switching device in the area of a control panel.
Figure 5:
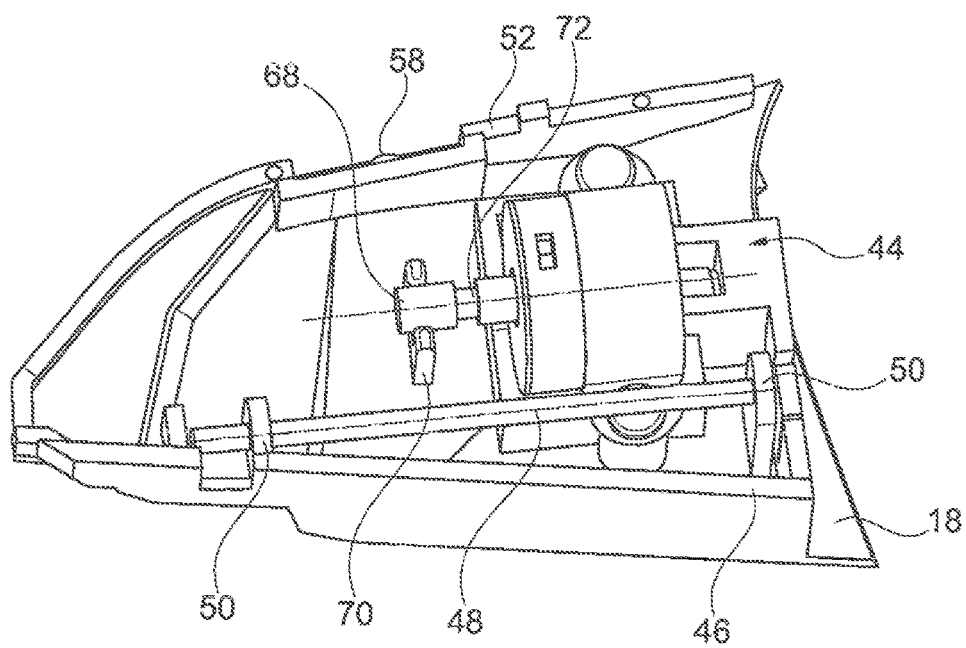
FIG. 5 shows a perspective top view of the disassembled switching device according to FIG. 1, with a view of a lower housing part and a haptics actuator inserted.
Figure 6:
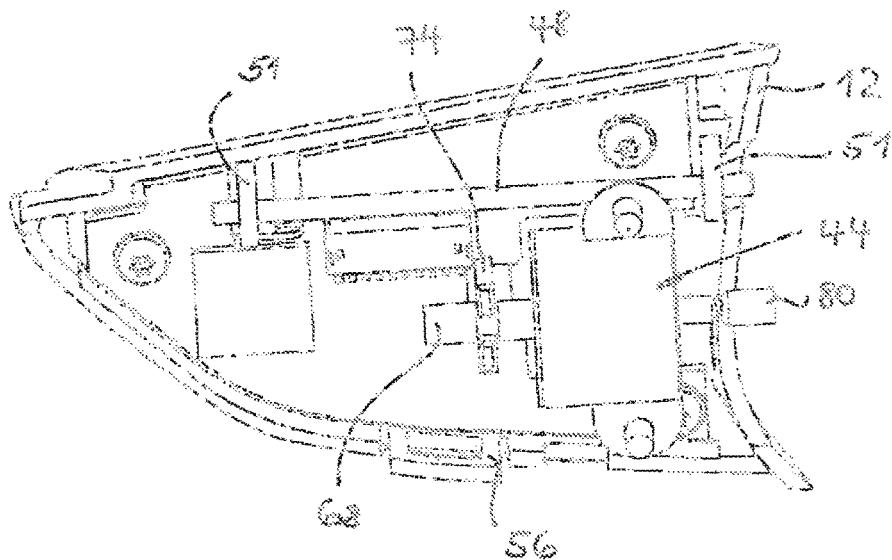
FIG. 6 shows a perspective bottom view of the switching device according to FIG. 1 illustrating the control element and the haptics actuator shown in FIG. 5.

The haptics actuator 44 comprises a coil 60 surrounded by a ferromagnetic core 62 which has the shape of a hollow ring and a multi-part configuration and which includes a first ring 64 and a second ring 66 slipped over it from the side. Seated in the interior of the coil 60 and of the ferromagnetic core 62 is a linearly displaceable armature 68 which, as is shown in FIGS. 4 and 5, is mounted by moans of a receiving geometry 70 integrally molded in the lower housing part 18. An appropriate receiving geometry is also provided for the rest of the haptics actuator 44, as is shown in FIG. 5.

The armature 88 is coupled to the control element 12 via a rib 74 which is clipped into a groove 72 in the armature 68 and protrudes on the bottom side of the control element 12. In the area of the groove 72, the rib 74 is formed such that it is seated in the groove 72 free of play in the axial direction, so that even the slightest movement of the armature 68 results in a deflection of the control element 12.

Figure 8:
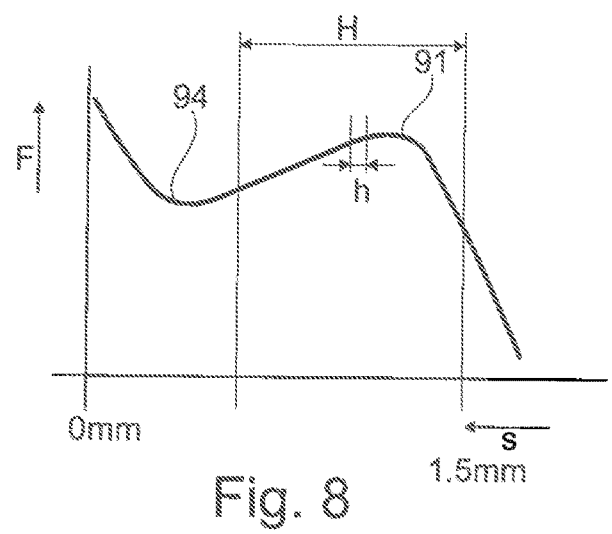
FIG. 8 shows the force-travel chart of the haptics actuator according to FIG. 7.

In this embodiment, with the coil 60 switched-on, the actuation causes the armature 68 to move to the right, the counter-movement being effected in this case by an elastic restoring element 80 which acts on the armature 68 either via a tappet or directly. A magnet 82 (see FIG. 7), which at the same time acts as an end stop for the armature 68, is provided in the interior of the haptics actuator. This end stop, however, is not reached by the working travel, so that no rattling noises can occur. In fact, the working travel h (see FIG. 8) is positioned for the haptics actuator 44 such that it is located remote from this end stop. For this purpose, the control element 12 has a recess 86 on its lower edge adjacent to the lower housing part 18 (see FIG. 2), an extension 88 protruding from the lower housing part 18 into the recess 86.

In FIG. 2, the gap arising between the two parts is illustrated with an exaggerated size. The working travel h amounts to only about a few tenths of a millimeter, whereas, without this stop, the control element 12 would be linearly displaceable by more than 1 mm, preferably more than 2 mm, in the direction transversely to the switch actuation direction A. It is, of course, also possible for the recess 88 to be provided on the lower housing part 18 and the extension 88 on the control element 12, i.e. vice versa. In any case, the two opposite wall sections 90 of the recess 86 function as stops for the extension 88.

The haptics actuator 44 would theoretically be at its force maximum when the armature 68 would rest against the stop, in this case the magnet 82. But since this starting position can deliberately not be reached, the electromagnet used is designed such that it has a second maximum 91 in its force-travel chart (see FIG. 8), in the range H of which the working travel h is located. Due to the possible tolerances, it is difficult to fix the exact position of the working travel h from the outset. For this reason, the range H is selected such that the working travel h is always located in an area within the larger range H which still ensures a high force exerted on the armature 68.

This second force maximum 91 is reached in that the ferromagnetic core 62 has a non-uniform thickness. More precisely, for example, one of the two rings, in this case the ring 66, has a conically tapering end 92 on its circular cylindrical inner wall, resulting in an increasingly smaller thickness towards the end. This causes the flux line absorbing capacity to decrease In this area and, vice versa, the magnetic saturation and the force increase as the cross-section increases towards the magnet 82.

The force minimum located on the force-travel curve of the haptics actuator 44 between the maximum at a deflection of 0 (corresponds to the position of the armature 66 at the stop) and the second force maximum 91 bears the reference numeral 94.

The invention claimed is:

1. A switching device, in particular in a motor vehicle, comprising
 a control element (12) including an operating interface (14),
 an electric haptics actuator (44) which is mechanically coupled to the control element (12) and displaces the latter for generating a haptic response signal when a switching signal is triggered,
 the haptics actuator (44) having a coil (60), an armature (68) that is displaceable by the coil (60), and at least one internal end stop for the armature movement, and
 the control element (12) being moved and coupled to the haptics actuator (44) such that the working travel (h) of the haptics actuator (44) is remote from the end stop,
 wherein the haptics actuator (44), starting from the end stop, has a force-travel characteristic with a force maximum (91) remote from the end stop and a force minimum (94) located between the end stop and the force maximum (91), the working travel (h) of the haptics actuator (44) being located in a section (H) remote from the end stop.

2. The switching device according to claim 1, wherein adjacent to the coil (60) there is a ferromagnetic core which has a varying thickness in the area of the working travel (h), preferably a thickness that increases from a starting position to the deflection position.

3. The switching device according to claim 1, wherein an elastic restoring element (80) is provided, which pushes the control element (12) and the armature (68) from a position as deflected by the coil (60) back to a starting position.

4. The switching device according to claim 1, wherein the control element (12) is mounted for linear displacement transversely to the direction of switch actuation.

5. The switching device according to claim 4, wherein the working travel is defined by two stops between which a part, in particular the control element (12), that is mechanically coupled to the armature (68) and is to be displaced is linearly displaceable.

6. The switching device according to claim 5, wherein a lower housing part (18) is provided which has the two stops formed thereon, more particularly that the lower housing part (18) or the part to be displaced includes a recess (86) having two opposite wall sections (90) which form the two stops, an extension (88) of the part to be displaced or of the lower housing part (18) protruding into the recess (86) and striking against the wall sections in an alternating fashion when the haptics actuator (44) is actuated.

7. The switching device according to claim 1, wherein the switching device is mounted substantially rigidly in the direction of switch actuation and has at least one touch-sensitive sensor (28).

8. The switching device according to claim 1, wherein the switching device includes at least one touch-sensitive, in particular capacitive sensor (28) and/or at least one pressure-sensitive sensor (32) which detects the actuation of the control element (12).

9. The switching device according to claim 1, wherein the control element (12) is a one-piece part and has a plurality of control panels (16) which are next to each other and which each have at least one sensor (28, 32) assigned thereto.

10. A switching device, preferably in a motor vehicle, according to claim 1, comprising
 a control element (12) including an operating interface (14),
 an electric haptics actuator (44) which is mechanically coupled to the control element (12) and displaces the latter transversely to the direction of the switch actuation in a displacement direction along a linear support for generating a haptic response signal when a switching signal is triggered,
 the linear support including at least one rod (48) extending in the displacement direction and at least one sliding element (51) which is seated on the rod (48) and is displaceable along the rod (48) and relative to the rod, and the control element (12) being mounted via a clip connection (54) in addition to the linear support, the clip connection preventing the control element (12) from swiveling around the rod (48) and allowing a movement of the control element (12) in the displacement direction.

11. The switching device according to claim 10, wherein the rod (48) is a separately produced part which is held by means of at least one bearing block.

12. The switching device according to claim 11, wherein the linear support extends along an edge of the control element (12) and the clip connection is provided on the opposite edge.

13. A switching device, preferably in a motor vehicle, according to claim 1, comprising:

a control element (12) including an operating interface (14) and having at least one control panel (16) which has both a touch-sensitive, in particular a capacitive sensor (32) and a pressure-sensitive sensor (28) associated with the control panel, the two sensors (28, 32) being connected such that they jointly activate an operating function.

14. The switching device according to claim 13, wherein a pressure tappet which is more particularly configured as an optical waveguide element (38) is provided for each control panel (16) on the inside of the control element (12), the pressure tappet passing a pressure force applied to the control panel (16) on to the pressure-sensitive sensor (28).

15. The switching device according to claim 13, wherein a capacitor plate (26) of the pressure-sensitive sensor (28) constitutes at the same time a capacitor plate (26) of a touch-sensitive sensor (32).

16. A switching device, preferably in a motor vehicle, according to claim 1, comprising a control element (12) including an operating interface (14) and having at least one control panel (16) which has a touch-sensitive sensor (32) associated with the control panel, a tolerance compensation element (30) being provided between two adjacent parts which is designed to be elastic, electrically conductive and is electrically coupled to a capacitor plate (26) of the at least one touch-sensitive sensor (32).

17. The switching device according to claim 16, wherein the tolerance compensation element (30) is accommodated in a pretensioned state in a space between a front face of the pressure tappet facing away from the control element (12) and an adjacent part, wherein more particularly a holding projection (36) protrudes from the front face of the pressure tappet facing away from the control element (12), the holding projection laterally fixing the tolerance compensation element (30) in position.

18. The switching device according to claim 16, wherein the tolerance compensation element (30) is configured as a restoring element for the control element (12), in particular for the associated control panel (16), for moving the control element from an engaged switching position to a starting position, and/or that the control element (12) is rigidly mounted in the operating direction and is elastically deformable for actuation of the pressure-sensitive sensor (28).

19. The switching device according to claim 16, wherein the tolerance compensation element (30) has a plate-shaped design and/ or is an electrically conducting plastic material, in particular a foamed material.

20. The switching device according to claim 16, wherein the tolerance compensation element (30) is electronically coupled to the adjacent capacitor plate (26) of the pressure-sensitive sensor (28), and/or that the tolerance compensation element (30) rests directly on a capacitor plate (26) of the at least one pressure-sensitive sensor (28).

21. The switching device according to claim 13, wherein a capacitor plate (22) of the at least one pressure-sensitive sensor (28) is seated on a printed circuit board (20) provided with electrical circuits.

22. The switching device according to claim 13, wherein the at least one pressure-sensitive sensor (28) includes two capacitor plates (22, 26) which are connected with each other by an elastic film (24).

\* \* \* \* \*